United States Patent
Olivadese et al.

(10) Patent No.: US 11,777,478 B2
(45) Date of Patent: Oct. 3, 2023

(54) DC CONVERSION OF HALF- TO QUARTER-WAVE RESONATORS FOR CROSSTALK SUPPRESSION IN SUPERCONDUCTING QUBITS

(71) Applicant: INTERNATIONAL BUSINESS MACHINES CORPORATION, Armonk, NY (US)

(72) Inventors: Salvatore Bernardo Olivadese, Stamford, CT (US); Patryk Gumann, Tarrytown, NY (US); Sean Hart, Tarrytown, NY (US); April Carniol, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 5 days.

(21) Appl. No.: 17/548,471

(22) Filed: Dec. 10, 2021

(65) Prior Publication Data
US 2023/0188124 A1    Jun. 15, 2023

(51) Int. Cl.
*G06N 10/20* (2022.01)
*H03K 5/1252* (2006.01)
*H03K 17/92* (2006.01)

(52) U.S. Cl.
CPC ........ *H03K 5/1252* (2013.01); *G06N 10/20* (2022.01); *H03K 17/92* (2013.01)

(58) Field of Classification Search
CPC ....... H03K 5/1252; H03K 17/92; G06N 10/20
USPC ........................................................ 327/527
See application file for complete search history.

(56) References Cited

U.S. PATENT DOCUMENTS

| | | | |
|---|---|---|---|
| 9,928,948 B2 | 3/2018 | Naaman et al. | |
| 10,353,844 B2 | 7/2019 | Naaman et al. | |
| 10,491,221 B1 | 11/2019 | Mckay et al. | |
| 10,540,603 B2 | 1/2020 | Naaman et al. | |
| 10,756,004 B1 | 8/2020 | Elsherbini et al. | |
| 10,803,396 B2 | 10/2020 | Yoscovits et al. | |
| 2017/0193388 A1 | 7/2017 | Filipp et al. | |
| 2019/0044051 A1 | 2/2019 | Caudillo et al. | |
| 2020/0320420 A1 | 10/2020 | Hart et al. | |
| 2020/0321508 A1* | 10/2020 | Hart ...................... | H10N 69/00 |

FOREIGN PATENT DOCUMENTS

| | | |
|---|---|---|
| EP | 3692476 A1 | 8/2020 |
| WO | 2019070265 A1 | 4/2019 |

OTHER PUBLICATIONS

Chow, J. M., "Quantum Information Processing with Superconducting Qubits"; Yale University Doctoral Dissertation (2010); 322 pgs (part 1 of 2, 161 pgs).
Chow, J. M., "Quantum Information Processing with Superconducting Qubits"; Yale University Doctoral Dissertation (2010); 322 pgs (part 2 of 2, 161 pgs.

(Continued)

*Primary Examiner* — Tomi Skibinski
(74) *Attorney, Agent, or Firm* — Intelletek Law Group, PLLC; Gabriel Daniel, Esq.

(57) ABSTRACT

A quantum circuit includes a first qubit and a second qubit. A bus resonator transmission line is coupled between the first qubit and the second qubit. A readout bus is coupled to the first qubit. A switch is coupled to the bus resonator transmission line between the first qubit and the second qubit.

18 Claims, 9 Drawing Sheets

(56) References Cited

OTHER PUBLICATIONS

Ritter, M. F., et al., "A Superconducting Switch Actuated by Injection of High Energy Electrons"; arXiv:2005.00462v1 [cond-mat.supr-con] (2020); 10 pgs.
Young, L. "Prediction of Absorption Loss in Multilayer Interference Filters"; Journal of the Optical Society of America (1962); vol. 52:7; pp. 753-761.
Murali, P. et al., "Software Mitigation of Crosstalk on Noisy Intermediate-Scale Quantum Computers"; arXiv:2001.02826v1 [quant-ph] (2020); 15 pgs.
Palacios-Laloy, A. et al., "Tunable Resonators for Quantum Circuits"; arXiv:0712.0221v1 (2007); 8 pgs.

* cited by examiner

DC CONVERSION OF HALF- TO QUARTER-WAVE RESONATORS FOR CROSSTALK SUPPRESSION IN SUPERCONDUCTING QUBITS

BACKGROUND

Technical Field

The present disclosure generally relates to superconducting devices, and more particularly, to qubit control having reduced crosstalk.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate. A quantum gate is a quantum circuit operating on a small number of qubits, which are building blocks of larger quantum circuits, like classical logic gates in conventional digital circuits. However, the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

SUMMARY

According to one embodiment, a quantum circuit includes a first qubit and a second qubit. A bus resonator transmission line is coupled between the first qubit and the second qubit. A readout bus is coupled to the first qubit. A switch is coupled to the bus resonator transmission line between the first qubit and the second qubit.

In one embodiment, the switch is a direct current (DC) controlled superconducting switch.

In one embodiment, the switch is at an electrical center of the bus resonator transmission line.

In one embodiment, the switch is at a location of a zero electric field of the bus resonator transmission line.

In one embodiment, the switch is at a location of a maximum magnetic field of the bus resonator transmission line.

In one embodiment, the readout bus is coupled to the switch and operative to control a state (e.g., turn ON and/or OFF) the resonator transmission line by way of a DC control signal. The bus resonator transmission line acts as a $\lambda/2$ resonator when the switch is closed by the DC control signal. The bus resonator transmission line acts as a $\lambda/4$ resonator when the switch is open the DC control signal.

In one embodiment, the switch has negligible power dissipation when the DC control signal is 0V.

In one embodiment, the switch has negligible noise generation when the DC control signal is 0V.

According to one embodiment, a method of controlling crosstalk in a quantum circuit, includes providing a first qubit and a second qubit. A bus resonator transmission line is coupled between the first qubit and the second qubit. A readout bus is coupled to the first qubit. The bus resonator transmission line is split with a switch coupled to the readout bus between the first qubit and the second qubit.

In one embodiment, the switch is a direct current (DC) controlled superconducting switch.

In one embodiment, the bus resonator transmission line is split by the switch at an electrical center of the bus resonator transmission line.

In one embodiment, the method further includes coupling the readout bus to the switch to turn ON and/or OFF the bus resonator transmission line by way of a DC control signal.

In one embodiment, the method further includes reducing a number of control lines by sharing the readout bus both for controlling the first qubit as well as a state of the switch.

In one embodiment, splitting the bus resonator transmission line includes placing the switch at a location of a zero electric field of the bus resonator transmission line.

In one embodiment, splitting the bus resonator transmission line includes placing the switch at a location of a maximum magnetic field of the bus resonator transmission line.

In one embodiment, the method further includes coupling the readout bus to the switch and turning ON and/or OFF the resonator transmission line by way of a DC control signal on the readout bus.

In one embodiment, the bus resonator transmission line acts as a $\lambda/2$ resonator when the switch is closed by the DC control signal. The bus resonator transmission line acts as a $\lambda/4$ resonator when the switch is open the DC control signal.

In one embodiment, the switch has negligible power dissipation when the DC control signal is 0V. The switch has negligible noise generation when the DC control signal is 0V.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
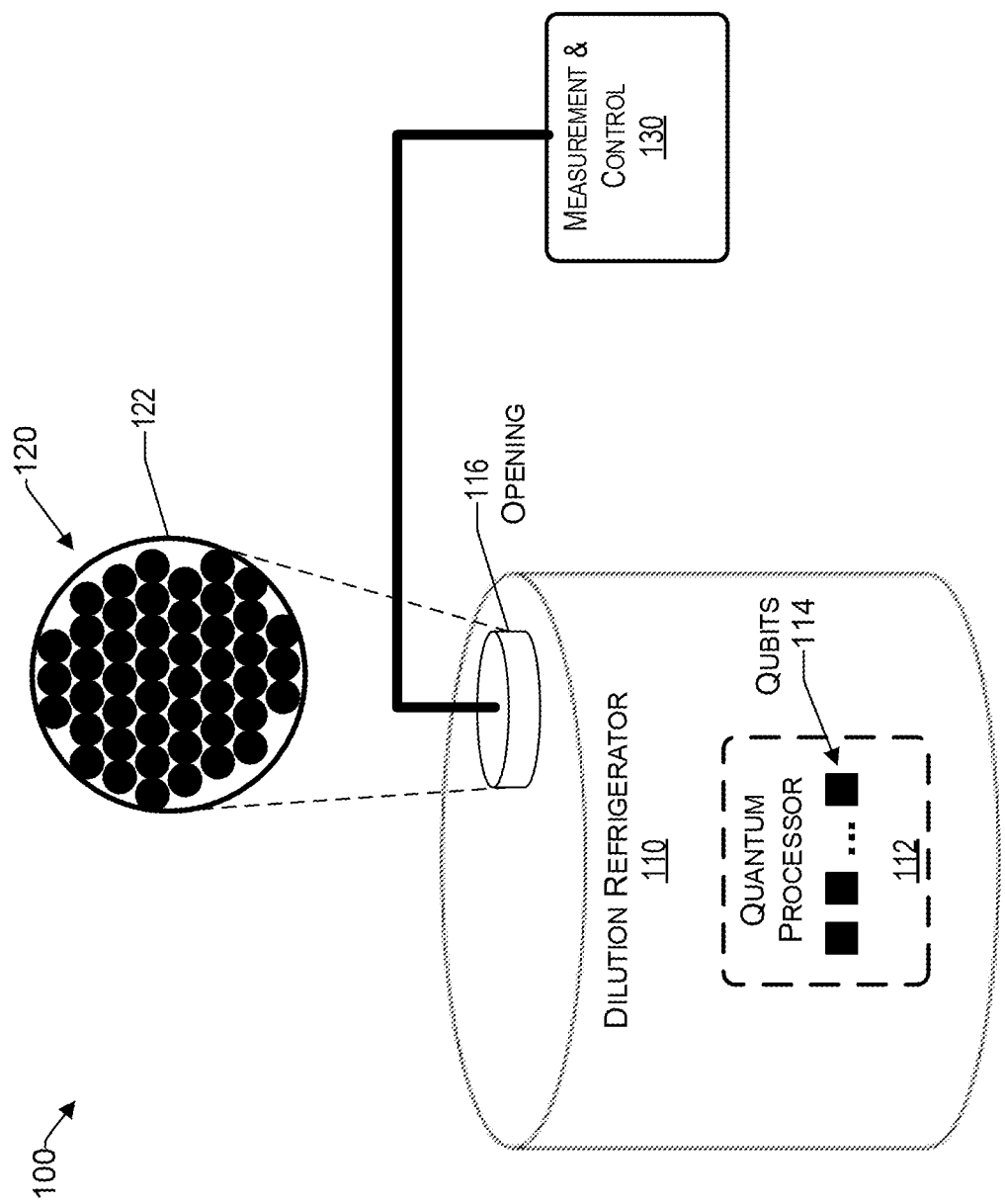
FIG. 1 is an example architecture of a quantum computing system, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In discussing the present technology, it may be helpful to describe various salient terms. As used herein a qubit represents a quantum bit and a quantum gate is an operation performed on a qubit, such as controlling the super-positioning between two qubits. It represents a basic unit of quantum information, namely the quantum version of the classical binary bit physically realized with a two-state device.

A superconducting qubit includes a Josephson junction. A Josephson junction is formed by separating two superconducting metal layers by a thin insulating material. When the metal in the superconducting layers is caused to become superconducting—e.g., by reducing the temperature of the metal to a specified cryogenic temperature—pairs of electrons can tunnel from one superconducting layer through the insulating layer to the other superconducting layer. In a qubit, the Josephson junction is electrically coupled in parallel with one or more capacitive devices forming a nonlinear microwave oscillator. The oscillator has a resonance/transition frequency determined by the value of the Josephson junction inductance and the parallel capacitance. A qubit is a superconducting qubit oscillator circuitry that employs a Josephson junction.

As used herein, the term crosstalk is a phenomenon by which a signal transmitted on one channel of a transmission system creates an undesired effect on another channel. It is a major source of noise in noisy intermediate-scale quantum (NISQ) systems, which corrupts the quantum state when multiple gates (e.g., instructions) are executed simultaneously. Crosstalk arises from fundamental challenges in quantum control hardware design such as unwanted interactions between the qubits and from leakage of the control signals (used to operate the gate) onto qubits that are not part of the intended gate operation. Crosstalk noise is prevalent across many of the leading qubits including superconducting and trapped ion qubits.

A controlled NOT (CNOT) gate is a quantum logic gate that is a salient component in the construction of a gate-based quantum computer. It can be used to entangle and disentangle Einstein-Podolsky-Rosen (EPR) states. Any quantum circuit can be simulated to an arbitrary degree of accuracy using a combination of CNOT gates and single qubit rotations.

As used herein, the electrical length, or phase length, refers to the length of an electrical conductor with respect to the phase shift introduced by transmission over that conductor at a predetermined frequency.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

The present disclosure generally relates to superconducting devices, and more particularly, to improving integrity of qubits by mitigating crosstalk between qubits. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Alternatively, or in addition, a microwave signal (e.g., pulse) can be used to entangle one or more qubits. Much of the process is performed in a cold environment (e.g., in a cryogenic chamber), while the microwave signal of a qubit is ultimately measured at room temperature. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons).

To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

As used herein, a bus resonator, relates to a qubit control line that carries signals to the qubit. A resonator is a device that stores energy for a short period of time. Using electromagnetic (EM) signals, two implementations include (i) lumped (e.g., LC circuit) or (ii) distributed (e.g., transmission line of an appropriate length). A qubit system may include one or more readout resonators coupled to the qubit. A readout resonator may be a transmission line that includes a capacitive connection to ground on one side and is either shorted to the ground on the other side, such as for a quarter wavelength resonator, or may have a capacitive connection to ground, such as for a half wavelength resonator, which results in oscillations within the transmission line, with the resonant frequency of the oscillations being close to the frequency of the qubit. For example, the readout resonator affects a pulse coming from the control/measurement instruments at the readout resonator frequency. The pulse acts as a measurement that decoheres the qubit and makes it collapse into a state of "one" or "zero," thereby imparting a phase shift on that measurement pulse.

The information processed by qubits is carried or transmitted in the form of microwave signals/photons in the range of microwave frequencies. The microwave frequency of a qubit output is determined by the resonance frequency of the qubit. The microwave signals are captured, processed, and analyzed to determine the quantum information encoded therein. A readout circuit is a circuit coupled with the qubit to capture, read, and measure the quantum state of the qubit. An output of the readout circuit is information usable by a quantum processor to perform computations.

Between qubits there may be a bus resonator transmission line, sometimes referred to herein as a coupler resonator, RIP bus, bus resonator, or simply coupler, which allows coupling different qubits together in order to realize quantum logic gates, such as CZ gates. The coupling resonator is typically structurally similar to the readout resonator. However, more complex designs are possible, as discussed herein.

When a qubit is implemented as a transmon, each side of the coupling resonator is coupled (e.g., capacitively or inductively) to a corresponding qubit by being in adequate proximity to (e.g., the capacitor of) the qubit. Since each side of the coupling resonator has coupling with a respective different qubit, the two qubits are coupled together through the coupling resonator (e.g., RIP bus). In this way, there is mutual interdependence in the state between coupled qubits, thereby allowing a coupling resonator to use the state of one qubit to control the state of another qubit. Entanglement occurs when the interaction between two qubits is such that the states of the two cannot be specified independently, but can only be specified for the whole system. In this way, the states of two qubits are linked together such that a measurement of one of the qubits, causes the state of the other qubit to collapse.

The ability to include more qubits is salient to being able to realize the potential of quantum computers. Generally, performance increases as temperature is lowered, for example by reducing the residual thermally-excited state qubit population and decreasing the thermal broadening of the qubit transition frequencies. Accordingly, the lower the temperature, the better for a quantum processor. Further, the crosstalk between an active qubit, sometimes referred to herein as a dominant qubit, with adjacent qubit, can increase the error rate. Crosstalk is a significant source of noise in NISQ systems. Such systems are noisy because there may not be a sufficient number of qubits to spare for error correction. Accordingly, the imperfect qubits may be used at the physical layer.

Applicants have recognized that to increase the computational power and reliability of a quantum computer, improvements can be made along two main dimensions. First is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

In general, there are two main sources of gate errors, namely decoherence (stochastic) and non-ideal interactions (deterministic). The latter includes parasitic coupling, leakage to non-computational states, and control crosstalk. For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the states of the qubit. This operational constraint on any circuit that operates with quantum information necessitates special considerations in fabricating semiconductor and superconducting structures that are used in such circuits.

In one aspect, the teachings herein are based on Applicants' insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits that mitigates crosstalk.

Example Architecture

FIG. 1 is an example architecture 100 of a quantum computing system, consistent with an illustrative embodiment. The architecture 100 includes a quantum processor 112 comprising a plurality of qubits 114. The quantum processor 112 is located in a refrigeration unit 110, which may be a dilution refrigerator. A dilution refrigerator is a cryogenic device that provides continuous cooling to temperatures typically 10 mK. Most of the physical volume of the architecture 100 is due to the large size of the refrigeration unit 110. To reach the near-absolute zero temperatures at which the system operates, the refrigeration unit 110 may us liquid helium as a coolant.

There is a measurement and control unit 130 that is outside of the refrigeration unit 110. The measurement and control unit 130 is able to communicate with the quantum processor through an opening 116, sometimes referred to as a bulkhead of the dilution refrigerator 110, which also forms a hermetic seal separating the ambient atmospheric pressure from the vacuum pressure of the cryostat under operation. A practical challenge in known refrigeration devices that house qubits 114 is that the number of qubits that can be accommodated in the refrigeration unit is limited due the number of wires between the measurement and control unit 130 and the qubits 114 measured/controlled thereby.

As the number of qubits 114 increases, for example to hundreds, thousands, or more, the opening 116 may not be large enough to accommodate all the lines 120 supporting the quantum processor 112 in the dilution refrigerator 110, making the number of lines 120 a salient consideration in the architectures discussed herein. Stated differently, access to the vacuum environment of the dilution refrigerator 110 is limited to the number of connectors that can fit through the bulkhead opening 116.

Figure 2:
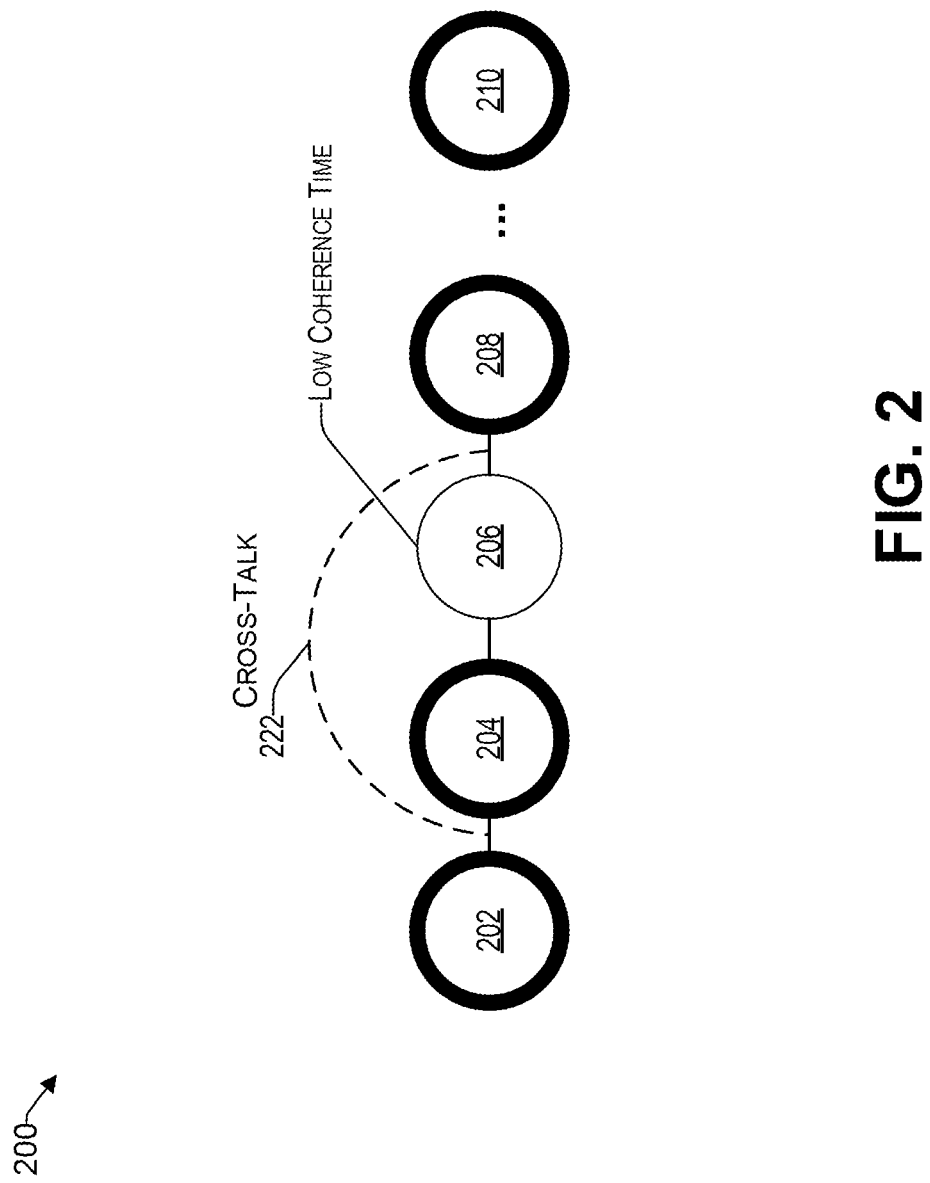
FIG. 2 illustrates an example qubit system having a plurality of qubits that are coupled by bus resonator transmission lines, consistent with an illustrative embodiment.

The plurality of qubits 114 may interact with one another. In this regard, FIG. 2 illustrates an example qubit system 200 having a plurality of qubits, where neighboring qubits are coupled by bus resonator transmission lines, consistent with an illustrative embodiment. Each of the nodes 202 to 210 represents a physical qubit. The edges between these nodes represent possible CNOT gates. For example, when a CNOT gate is executed on qubits 202 and 204, and another CNOT gate is executed concurrently on qubits 206 and 208, the error rate of both CNOTs increases because of crosstalk 222. Qubit 206 has low coherence, which means that a computation on that qubit 206 may be error prone. While bus resonators are salient for gate operation, the presence of such communication channel between qubits may introduce undesirable crosstalk.

In one aspect, the teachings herein provide an architecture that substantially reduces crosstalk between qubits by way of an active control of the qubits that does not require additional control lines between the measurement and control unit 130 and the qubits 114 of FIG. 1.

Example Layouts and Systems

Figure 3:
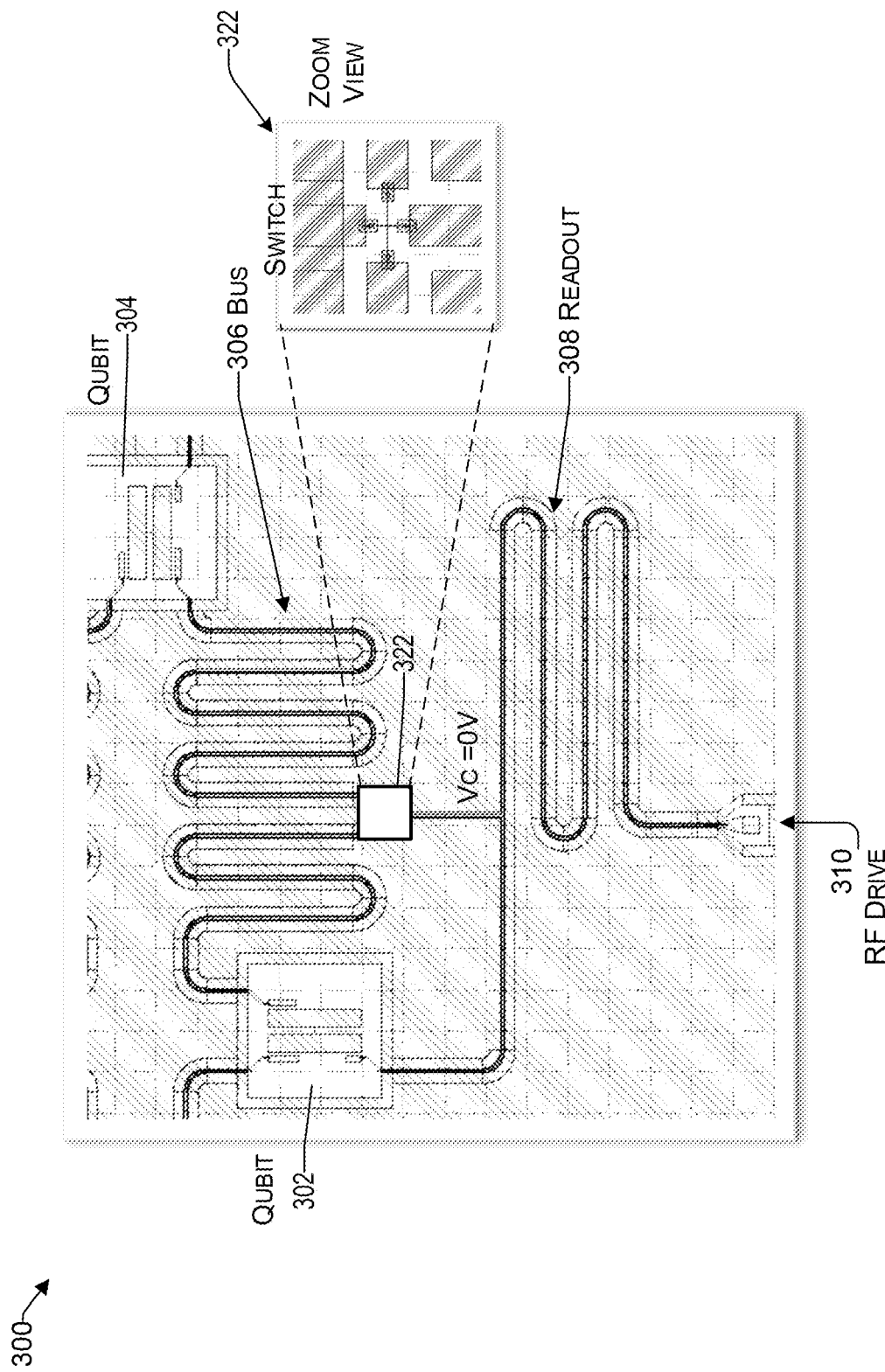
FIG. 3 is a floorplan of qubit circuit, consistent with an illustrative embodiment.

FIG. 3 is a floorplan 300 of quantum circuit, consistent with an illustrative embodiment. The floorplan 300 of the quantum circuit includes a first qubit 302 and a second qubit 304, as well as a bus resonator transmission line 306 coupled between the first qubit 302 and the second qubit 304. There is a readout bus 308 coupled to the first qubit and operative to provide an RF drive 310 to the first qubit 302. The readout bus 308 facilitates control of the first qubit 302 such that the state of the first qubit 302 can be read and/or changed.

The bus resonator transmission line 306, is salient for gate operations. However, the presence of such communication channel between qubits 302 and 304 may cause crosstalk between these qubits 302 and 304. For example, when multiple instructions are executed, crosstalk can corrupt the quantum state and lead to incorrect program execution. In this regard, Applicants have determined that placing a (e.g., DC controlled superconducting) switch 322 to intersect the bus resonator transmission line 306 provides for better cross-talk isolation (e.g., elimination) between the first qubit 302 and the second qubit 304. More specifically, Applicants have determined that placing the switch in the middle (i.e., center of the electrical length) of the bus resonator transmission line 306 avoids some loss mechanisms, such as not affecting the T1 and T2 (i.e., relaxation time and coherence, respectively) of the qubits 302 and 304, as is explained in more detail below. By providing a switch 322 between in the middle of the bus resonator transmission line 306, not only is cross-talk reduced, but loss mechanisms are avoided, while regular operation of the qubits is maintained.

In one embodiment, the switch 322 is controlled by a common readout bus 308. For example, the readout bus 308 can provide a DC signal to control the ON and OFF state of the switch 322. By sharing the readout bus 308 for access of the first qubit 302 and the switch 322, the number of wires through the opening 116 are not increased.

Figure 4:
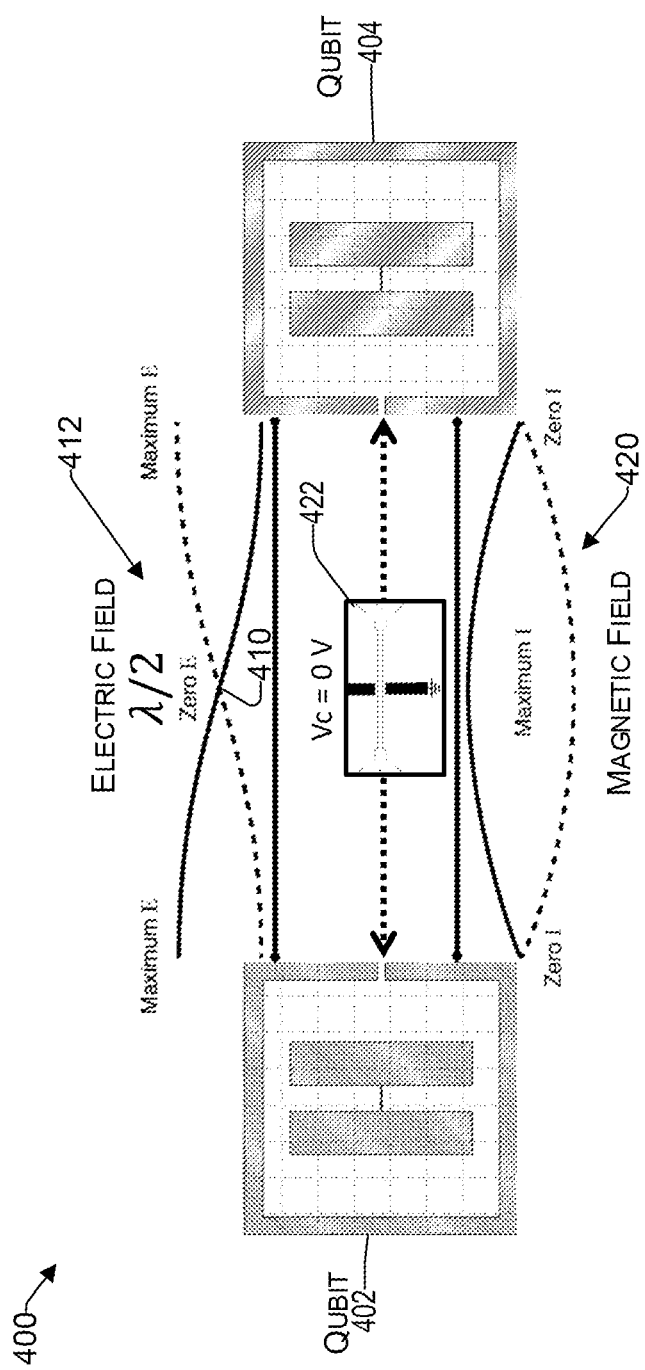
FIG. 4 illustrates a qubit system having a control switch that is in a first state (e.g., turned ON), consistent with an illustrative embodiment.

Reference now is made to FIG. 4, which illustrates a qubit system 400 having a control switch that is in a first state (e.g., turned ON), consistent with an illustrative embodiment. Qubit system 400 includes a first qubit 402 and a second qubit 404 that are coupled together by a bus resonator transmission line. There is a superconducting switch 422 between the first qubit 402 and the second qubit 404, separating two portions of the bus resonator transmission line. The superconducting switch 422 is controlled by a DC voltage. In the example of FIG. 4, the voltage Vc is 0V, which keeps the switch closed (i.e., able to transmit). In one embodiment, the superconducting switch is placed in the middle of the bus resonator transmission line to avoid dissipation and/or other substantive parasitic effects that could interfere with the efficient operation of the qubit system 400.

As is illustrated in FIG. 4, the middle point 410 of the bus resonator transmission line is at a zero magnitude of electric field 412, as well as maximum value for the magnetic field 420 (i.e., as current travels across the bus resonator transmission line). The bus resonator transmission line acts as a $\lambda/2$ resonator. Accordingly, placing the superconducting switch at this middle point is subject to negligible (e.g., no) power dissipation of the superconducting switch 410 when the voltage applied to the switch is 0V, which helps prevent any stray signals (e.g., cross-talk) from the first qubit 402 to the second qubit 404. The operation of the qubit system 400 can be better understood in view of the discussion of FIG. 5 below.

Figure 5:
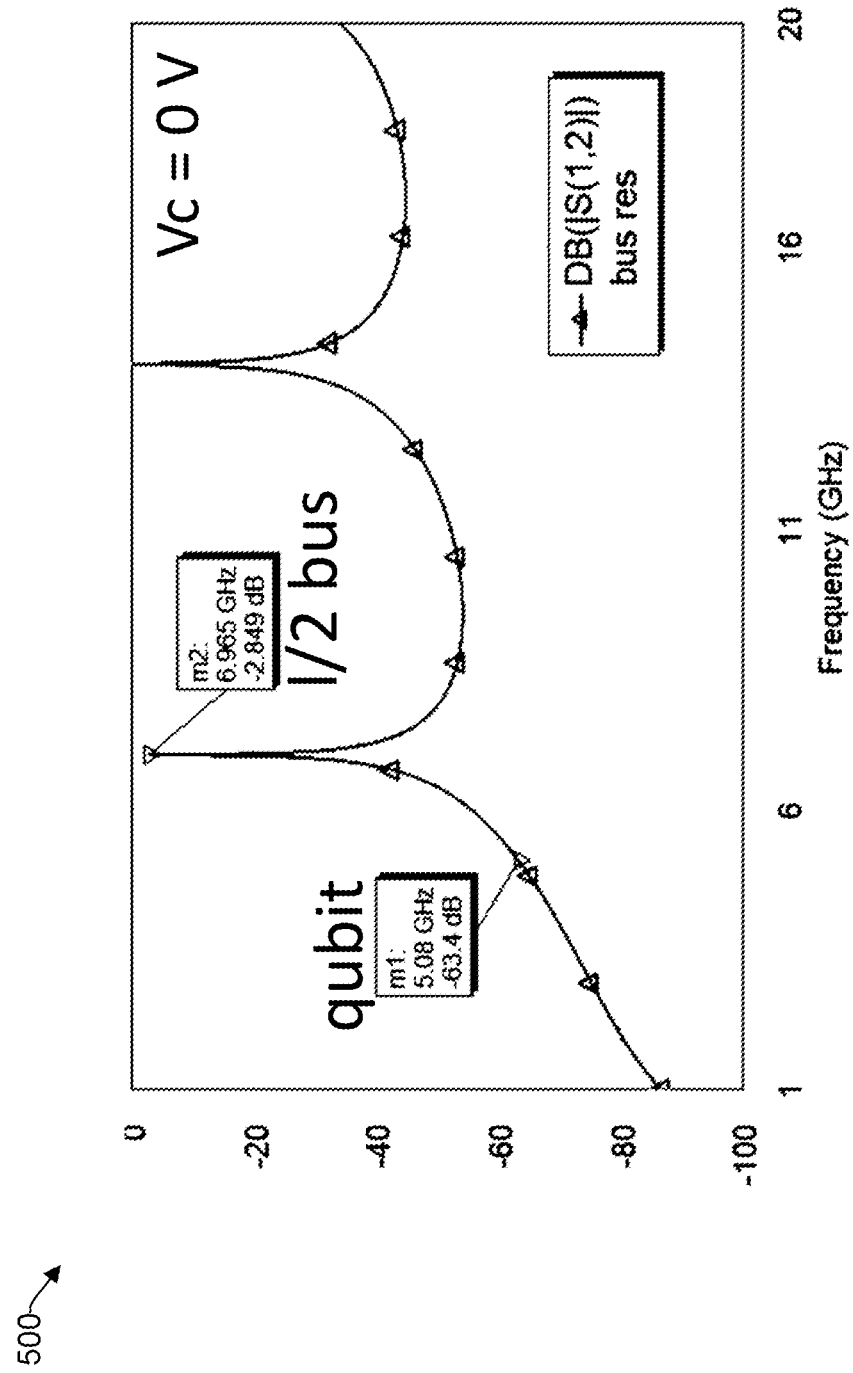
FIG. 5 is a plot of a resonance of the bus resonator transmission line of FIG. 4, consistent with an illustrative embodiment.

FIG. 5 is a plot 500 of a resonance of the bus resonator transmission line of FIG. 4, consistent with an illustrative embodiment. The plot 500 is discussed with reference to the qubit system of FIG. 4. The plot 500 illustrates that, when a voltage of 0V is applied to the superconducting switch 422, there is resonance at approximately 7 GHz as well as 14 GHz. The qubit resonance is at approximately 5 GHz and, therefore, close to the first resonance of the bus resonator of 7 GHz. In this way, the bus resonator can communicate with a qubit (e.g., 402 or 404) even without a superconducting switch 422. Accordingly, regular operation of the qubit system 400 can continue unabated by the superconductor switch 422 when Vc=0.

Figure 6:
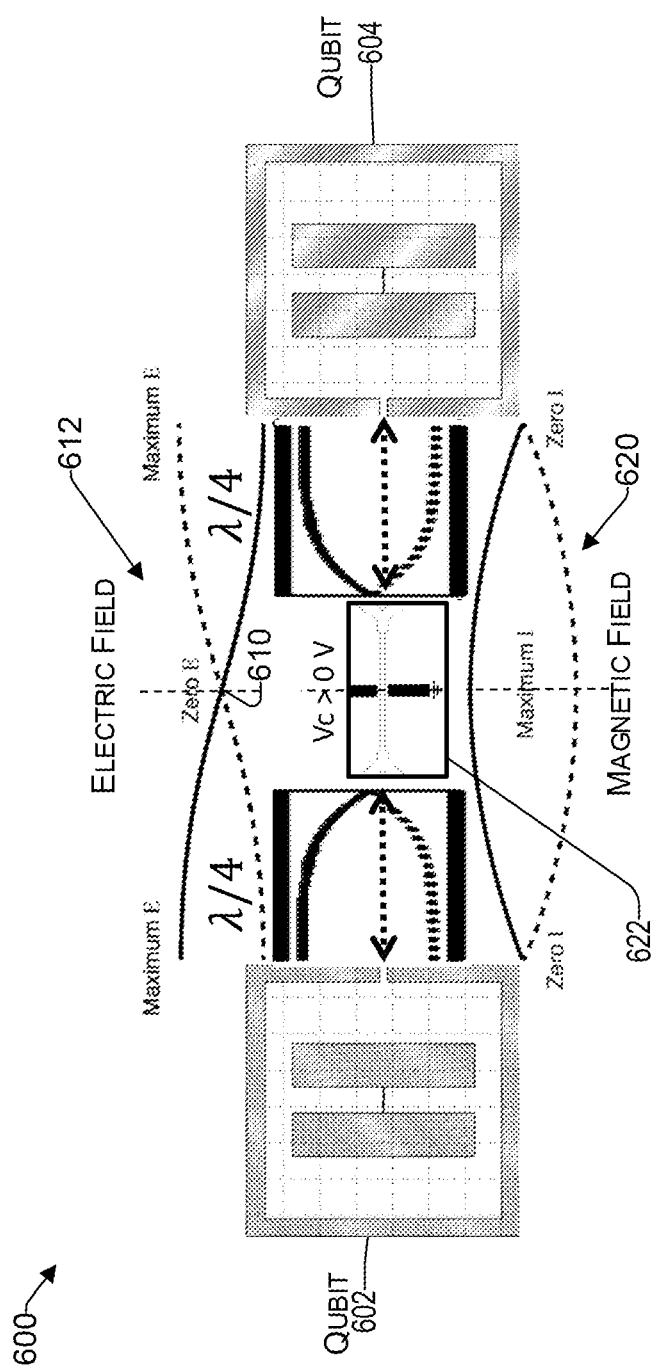
FIG. 6, which illustrates a qubit system having a control switch that is in a second state (e.g., turned OFF), consistent with an illustrative embodiment.

Reference now is made now to FIG. 6, which illustrates a qubit system 500 having a control switch 622 that is in a second state (e.g., turned OFF), consistent with an illustrative embodiment. Accordingly, the superconducting switch 622, which is in the middle of a bus resonator transmission line between qubits 602 and 604, is at a voltage Vc>0V. By virtue of turning OFF the superconducting switch 622, the $\lambda/2$ operation of the bus resonator transmission line discussed in the context of FIG. 4, is split into two separate $\lambda/2$ bus resonator transmission lines from an electric field 612 point of view. A virtual closed boundary condition is created where there is no dissipation or noise generated in this split condition in the center point 610. That is because the power across the switch is 0 (P=VI=0). The magnetic field 620 across the bus resonator transmission line remains substantially the same. The operation can be better understood in view of FIG. 7 discussed below.

Figure 7:
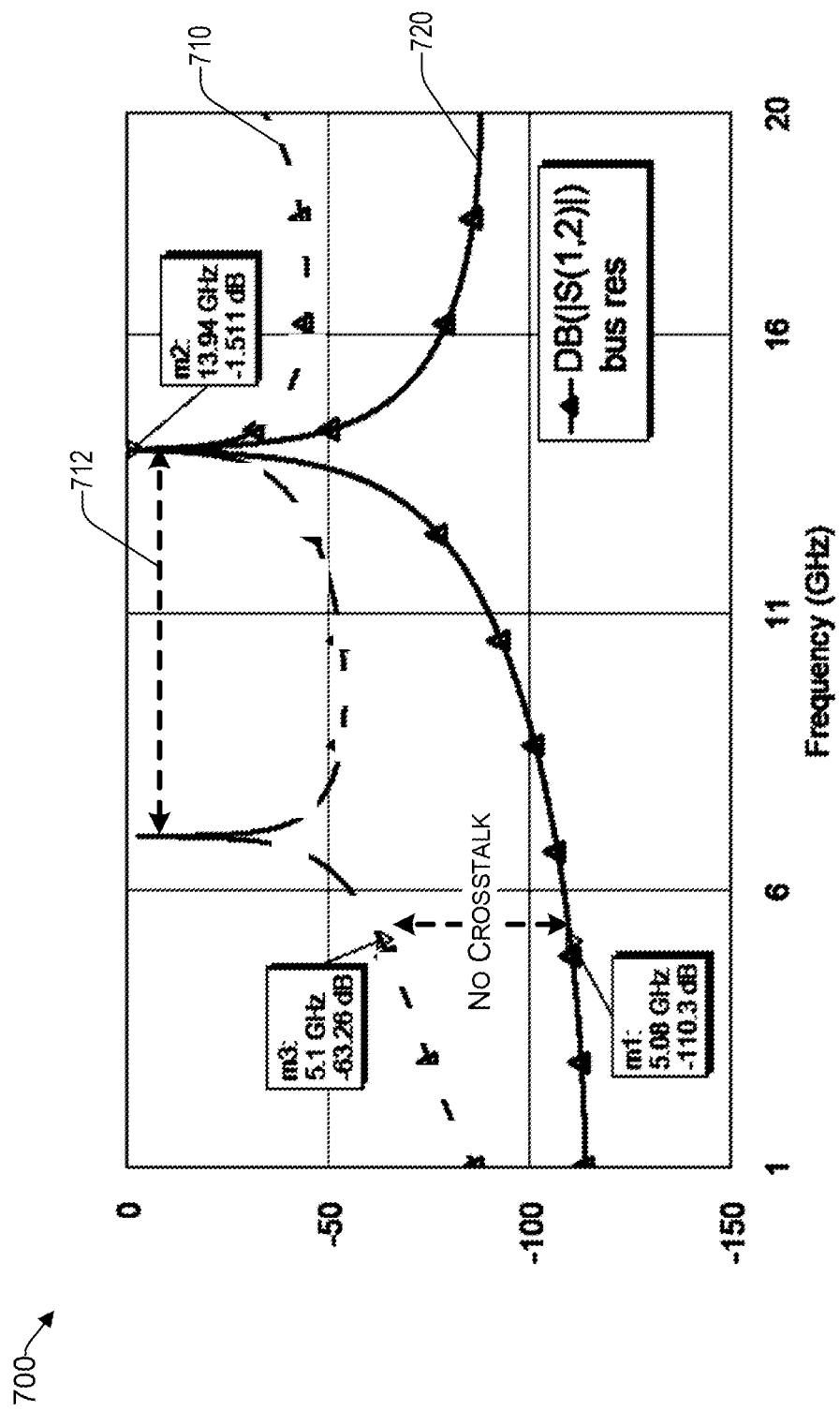
FIG. 7 is a plot of a resonance of the bus resonator transmission line of FIG. 6, where the switch is in a second state (e.g., turned OFF), consistent with an illustrative embodiment.

FIG. 7 is a plot 700 of a resonance of the bus resonator transmission line of FIG. 6, where the switch is in a second state (e.g., turned OFF), consistent with an illustrative embodiment. By way of contrast, plot 700 also includes the response of the bus resonator transmission line when the switch is ON (i.e., closed), represented by the dashed curve 710. The plot 700 illustrates that, when a voltage of >0V is applied to the superconductor switch 622, the switch becomes a high resistivity conductor (e.g., switch is "open"). The first resonance at approximately 7 GHz (illustrated as a dotted line) is removed. What remains is the resonance at approximately 14 GHz. The frequency of the bus resonator transmission line doubles because frequency is inversely proportional to the length of the bus resonator transmission line, which has been effectively split in half by the DC controlled superconductor switch 622. Since the qubit resonance remains at approximately 5 GHz, the magnitude of the communication coupling with the qubit 712 is substantially lower. In this way, stray communication by way of crosstalk is substantially reduced (e.g., eliminated).

Figure 8:
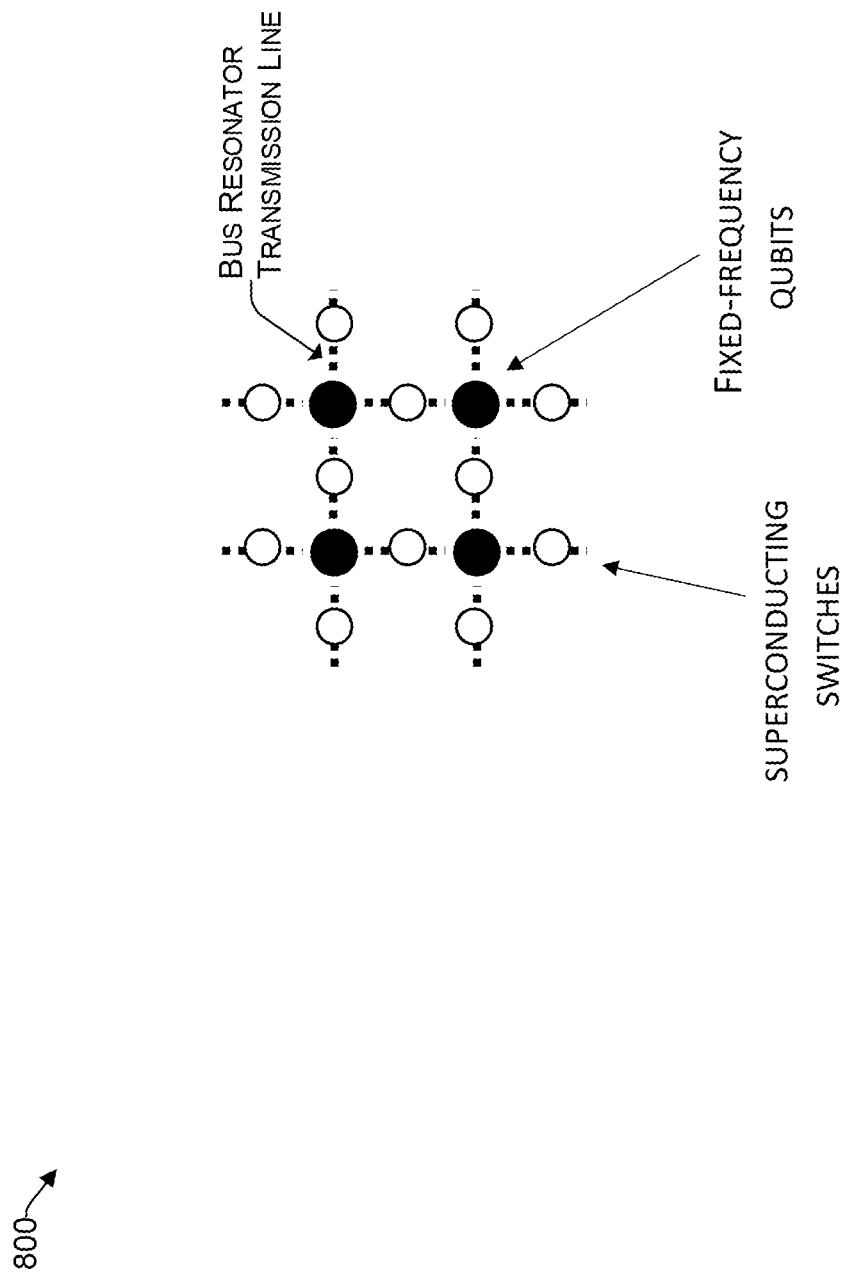
FIG. 8 is a conceptual floorplan of a quantum system that include switches between qubits, consistent with an illustrative embodiment.

Reference now is made to FIG. 8, which is a conceptual floorplan 800 a quantum system that include switches (e.g., DC controlled superconductor switches) between qubits, consistent with an illustrative embodiment. The solid nodes represent (e.g., fixed) frequency qubits. The bus resonator transmission lines that are coupled between the qubits are represented by dotted lines. The hollow nodes represent superconducting switches that split the bus resonator transmission lines at their electrical center. Counterintuitively, the addition of the DC controlled superconductor switch does not introduce dissipation, noise, or power loss. For example, dissipation refers to the energy being moved (i.e., dissipated) at a different place of the device. Noise is any undesired signal added to the device. Power loss is energy dissipated as a function of time.

Further, the control of these switches does not increase the number of control lines that are used in the cryogenic environment, thereby not interfering with the number of qubits that can be operated in the cryogenic environment. In various embodiments, the teachings herein can be used for readout resonators or direct connections between multiple qubits. While two qubit systems have been described herein by way of example for reasons of simplicity and to avoid clutter, it will be understood that multi-qubit topologies and readout resonators are within the scope of the present disclosure.

Example Computer Platform

Figure 9:
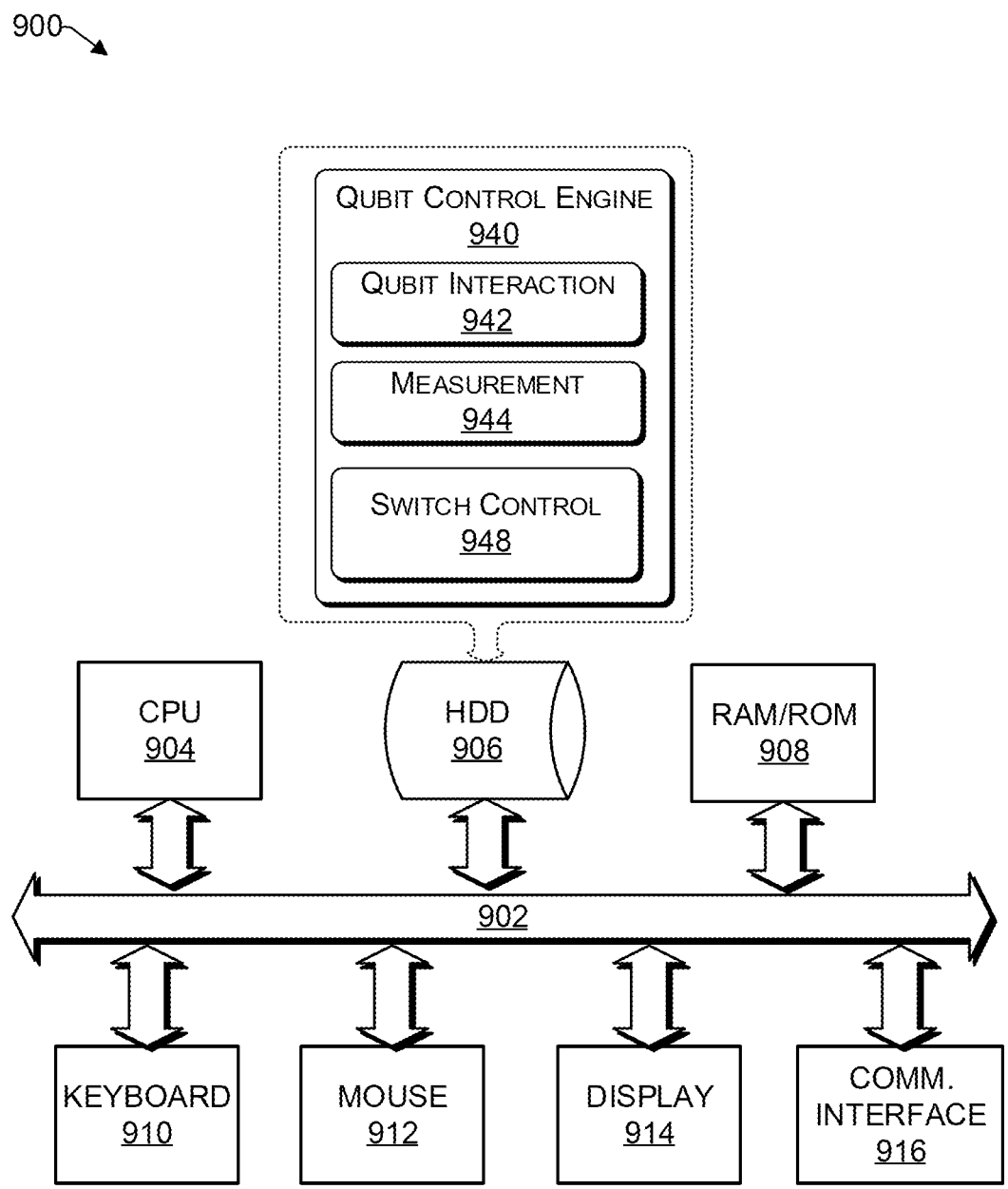
FIG. 9 provides a functional block diagram illustration of a computer hardware platform that can be used to implement a particularly configured computing device similar to the measurement and control unit of FIG. 1.

As discussed above, functions relating to mitigating crosstalk between qubits may include a measurement and control unit, as shown in FIG. 1. FIG. 9 provides a functional block diagram illustration of a computer hardware platform 900 that can be used to implement a particularly configured computing device that can host a qubit control engine 940 operative to perform the functions discussed herein. In particular, FIG. 9 illustrates a network or host computer platform 900, as may be used to implement an appropriately configured computing device, such as the measurement and control block 130 of FIG. 1.

The computer platform 900 may include a central processing unit (CPU) 904, a hard disk drive (HDD) 906, random access memory (RAM) and/or read only memory (ROM) 908, a keyboard 910, a mouse 912, a display 914, and a communication interface 916, which are connected to a system bus 902.

In one embodiment, the HDD 906, has capabilities that include storing a program that can execute various processes, such as the qubit control engine 940, in a manner described herein. The qubit control engine 940 may have various modules configured to perform different functions. For example, there may be a qubit interaction module 942 operative to control a state of one or more qubits of a qubit array. There may be a measurement module 944 operative to determine a state of a qubit by way of a readout bus. There may be a switch control module 948 operative to determine an ON and OFF state of one or more switches that are coupled between pairs of qubits having a shared bus resonator transmission line in a manner discussed herein.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of an appropriately configured computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A quantum circuit comprising:
   a first qubit;
   a second qubit;
   a bus resonator transmission line coupled between the first qubit and the second qubit;
   a readout bus coupled to the first qubit; and
   a switch coupled to the bus resonator transmission line between the first qubit and the second qubit, wherein the switch is at a location of a zero electric field of the bus resonator transmission line.

2. The quantum circuit of claim 1, wherein the switch is a direct current (DC) controlled superconducting switch.

3. The quantum circuit of claim 1, wherein the switch is at an electrical center of the bus resonator transmission line.

4. A quantum circuit comprising:
   a first qubit;
   a second qubit;
   a bus resonator transmission line coupled between the first qubit and the second qubit, a readout bus coupled to the first qubit; and
   a switch coupled to the bus resonator transmission line between the first qubit and the second qubit, wherein the switch is at a location of a maximum magnetic field of the bus resonator transmission line.

5. A quantum circuit comprising:
   a first qubit;
   a second qubit;
   a bus resonator transmission line coupled between the first qubit and the second qubit;
   a readout bus coupled to the first qubit; and
   a switch coupled to the bus resonator transmission line between the first qubit and the second qubit, wherein the readout bus is coupled to the switch and operative to turn ON and/or OFF the resonator transmission line by way of a DC control signal.

6. The quantum circuit of claim 5, wherein the bus resonator transmission line acts as a $\lambda/2$ resonator when the switch is closed by the DC control signal.

7. The quantum circuit of claim 6, wherein the bus resonator transmission line acts as a $\lambda/4$ resonator when the switch is open the DC control signal.

8. The quantum circuit of claim 5, wherein the switch has negligible power dissipation when the DC control signal is 0V.

9. The quantum circuit of claim 8, wherein the switch has negligible noise generation when the DC control signal is 0V.

10. A method of controlling crosstalk in a quantum circuit, comprising:

providing a first qubit;

providing a second qubit;

coupling a bus resonator transmission line between the first qubit and the second qubit;

coupling a readout bus to the first qubit;

splitting the bus resonator transmission line with a switch coupled to the readout bus between the first qubit and the second qubit; and coupling the readout bus to the switch to turn ON and/or OFF the bus resonator transmission line by way of a DC control signal.

11. The method of claim 10, wherein the switch is a direct current (DC) controlled superconducting switch.

12. The method of claim 10, wherein the bus resonator transmission line is split by the switch at an electrical center of the bus resonator transmission line.

13. The method of claim 10, further comprising reducing a number of control lines by sharing the readout bus both for controlling the first qubit as well as a state of the switch.

14. The method of claim 10, wherein splitting the bus resonator transmission line comprises placing the switch at a location of a zero electric field of the bus resonator transmission line.

15. The method of claim 10, wherein splitting the bus resonator transmission line comprises placing the switch at a location of a maximum magnetic field of the bus resonator transmission line.

16. The method of claim 10, further comprising:

coupling the readout bus to the switch; and turning ON and/or OFF the resonator transmission line by way of a DC control signal on the readout bus.

17. The method of claim 16, wherein:

the bus resonator transmission line acts as a $\lambda/2$ resonator when the switch is closed by the DC control signal; and the bus resonator transmission line acts as a $\lambda/4$ resonator when the switch is open the DC control signal.

18. The method of claim 17, wherein:

the switch has negligible power dissipation when the DC control signal is 0V; and the switch has negligible noise generation when the DC control signal is 0V.

\* \* \* \* \*